(12) United States Patent
Ando et al.

(10) Patent No.: US 11,527,616 B2
(45) Date of Patent: Dec. 13, 2022

(54) VERTICAL TRANSPORT CMOS TRANSISTORS WITH ASYMMETRIC THRESHOLD VOLTAGE

(71) Applicant: International Business Machines Corporation, Armonk, NY (US)

(72) Inventors: Takashi Ando, Eastchester, NY (US); Choonghyun Lee, Rensselaer, NY (US); Jingyun Zhang, Albany, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 16/953,447

(22) Filed: Nov. 20, 2020

(65) Prior Publication Data

US 2022/0165850 A1 May 26, 2022

(51) Int. Cl.
| | | |
|---|---|---|
| *H01L 27/092* | (2006.01) | |
| *H01L 29/78* | (2006.01) | |
| *H01L 29/417* | (2006.01) | |
| *H01L 29/66* | (2006.01) | |
| *H01L 29/10* | (2006.01) | |

(Continued)

(52) U.S. Cl.
CPC .. *H01L 29/1037* (2013.01); *H01L 21/823807* (2013.01); *H01L 21/823857* (2013.01); *H01L 21/823871* (2013.01); *H01L 21/823878* (2013.01); *H01L 21/823885* (2013.01); *H01L 27/092* (2013.01); *H01L 29/161* (2013.01); *H01L 29/41741* (2013.01);

(Continued)

(58) Field of Classification Search
CPC ......... H01L 29/41741; H01L 29/66666; H01L 29/7827; H01L 21/823807; H01L 21/823857; H01L 21/823871; H01L 21/823878; H01L 21/823885
See application file for complete search history.

(56) References Cited

U.S. PATENT DOCUMENTS

| 8,237,197 B2 | 8/2012 | Chen et al. |
| 9,859,423 B2 | 1/2018 | Liu et al. |

(Continued)

OTHER PUBLICATIONS

Narasimhulu et al., "Impact of lateral asymmetric channel doping on deep submicrometer mixed-signal device and circuit performance," IEEE Transactions on Electron Devices, vol. 50, No. 12, 2003, 9 pages.

(Continued)

*Primary Examiner* — Nelson Garces
(74) *Attorney, Agent, or Firm* — Jeffrey M. Ingalls

(57) ABSTRACT

A semiconductor structure for triggering asymmetric threshold voltage along a channel of a vertical transport field effect transistor (VTFET) is provided. The semiconductor structure includes a first set of fins including a SiGe layer and a first material layer formed on the SiGe layer, a second set of fins including the SiGe layer and a second material layer formed on the SiGe layer, a first high-κ metal gate disposed over the first set of fins, and a second high-κ metal gate disposed over the second set of fins. An asymmetric threshold voltage is present along the channel of the VTFET in a region defined at a bottom of the first and second set of fins, and a Ge content of the second material layer is higher than a Ge content of the SiGe layer.

14 Claims, 10 Drawing Sheets

(51) Int. Cl.
   *H01L 29/161*   (2006.01)
   *H01L 21/8238*  (2006.01)
   *H01L 29/51*    (2006.01)

(52) U.S. Cl.
   CPC ...... *H01L 29/517* (2013.01); *H01L 29/66666* (2013.01); *H01L 29/7827* (2013.01)

(56) References Cited

U.S. PATENT DOCUMENTS

| | | |
|---|---|---|
| 10,128,235 B2 | 11/2018 | Bi et al. |
| 10,297,668 B1 | 5/2019 | Lee et al. |
| 10,529,716 B1 | 1/2020 | Lee et al. |
| 10,573,723 B1 | 2/2020 | Ando et al. |
| 10,600,883 B2 | 3/2020 | Lee et al. |
| 10,818,756 B2 * | 10/2020 | Lee ............... H01L 29/165 |
| 2012/0098067 A1 | 4/2012 | Yin |
| 2013/0207162 A1 | 8/2013 | Khakifirooz |
| 2016/0315016 A1 | 10/2016 | Moll |
| 2018/0247938 A1 | 8/2018 | Cheng et al. |
| 2020/0111714 A1 | 4/2020 | Lee |
| 2020/0111787 A1* | 4/2020 | Lee ............... H01L 29/7827 |
| 2020/0111788 A1 | 4/2020 | Lee |

OTHER PUBLICATIONS

Baek et al., "Device optimization of n-channel MOSFETs with lateral asymmetric channel doping profiles," Transactions on Electrical and Electronic Materials, vol. 11, No. 1, 2010, 5 pages.
International Search Report and Written Opinion, PCT/CN2021/126098, dated Jan. 25, 2022, 8 pages.

\* cited by examiner

VERTICAL TRANSPORT CMOS TRANSISTORS WITH ASYMMETRIC THRESHOLD VOLTAGE

BACKGROUND

The present disclosure relates generally to semiconductor devices, and more specifically, relates to an asymmetric threshold voltage vertical transport field effect transistor (VTFET) with intrinsic dual channel epitaxy, and methods of fabricating VTFET devices.

In recent years, with increases in the degree of integration, functionality, and speed of semiconductor devices, there is an increasing demand for miniaturization of semiconductor devices. To meet the demand, various device structures have been proposed for reducing an area occupied by transistors over a substrate. Among them, a field effect transistor (FET) having a fin-type structure (FinFET) has drawn attention. FinFETs are three-dimensional structures that rise above the substrate and resemble a fin. It is desirable to have improvements in the fabrication of FinFET transistors to improve quality of transistor contacts. VTFETs are an example of a FinFET device and are oriented with a vertical fin-type channel structure that is disposed on the bottom source and drain electrodes. Also, top source and drain electrodes are disposed on the fin channel. VTFETs are being explored as a viable device option for continued complementary metal oxide semiconductor (CMOS) scaling beyond the 7 nanometer (nm) technology node.

SUMMARY

Embodiments of the present disclosure relate to a semiconductor structure for triggering asymmetric threshold voltage along a channel of a vertical transport field effect transistor (VTFET) is provided. The semiconductor structure includes a first set of fins including a SiGe layer and a first material layer formed on the SiGe layer, a second set of fins including the SiGe layer and a second material layer formed on the SiGe layer, a first high-κ metal gate disposed over the first set of fins, and a second high-κ metal gate disposed over the second set of fins. An asymmetric threshold voltage is present along the channel of the VTFET in a region defined at a bottom of the first and second set of fins, and a Ge content of the second material layer is higher than a Ge content of the SiGe layer.

Other embodiments of the present disclosure relate to a method for triggering asymmetric threshold voltage along a channel of a vertical transport field effect transistor (VTFET). The method includes forming a first set of fins including a SiGe layer and forming a first material layer on the SiGe layer, forming a second set of fins including the SiGe layer and forming a second material layer on the SiGe layer, forming a first high-κ metal gate over the first set of fins, and forming a second high-κ metal gate over the second set of fins. An asymmetric threshold voltage is present along the channel of the VTFET in a region defined at a bottom of the first and second set of fins, and wherein a Ge content of the second material layer is higher than a Ge content of the SiGe layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
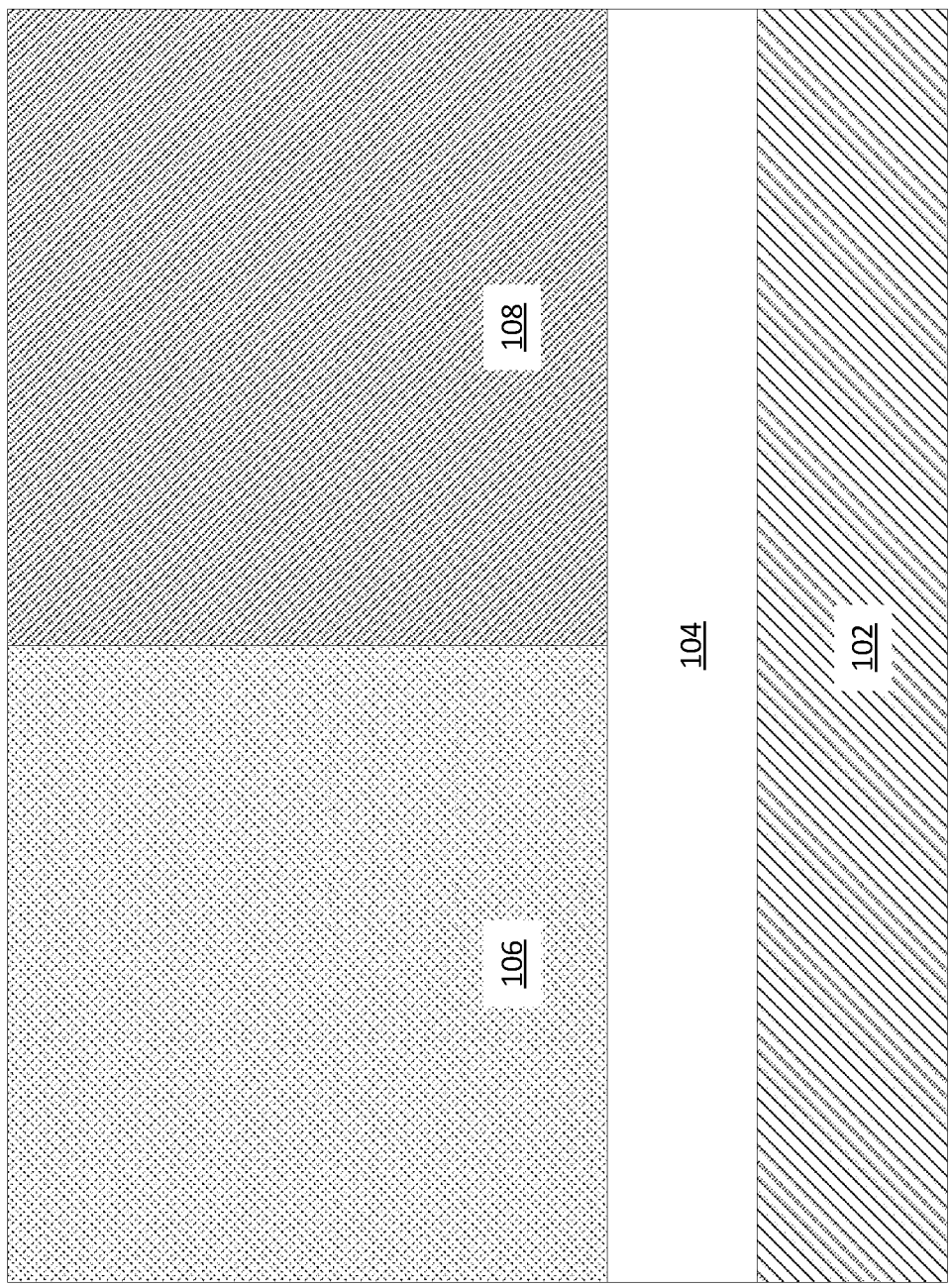
FIG. 1 is a cross-sectional view of a semiconductor structure including channel epi and having a fin structure including a low content SiGe layer formed over a semiconductor substrate, in accordance with an embodiment.

Embodiments in accordance with the present disclosure provide methods and devices for forming an asymmetric threshold voltage vertical transport field effect transistor (VTFET) with intrinsic dual channel epitaxy.

The lateral asymmetric channel (LAC) doping profile approach provides one of the most effective ways to improve the electrical characteristics of metal oxide semiconductor field effect transistors (MOSFETs). For lateral asymmetric channel (LAC) MOSFETs, the doping concentration of the source side is higher than that of the drain side in the channel. The channel potential transition at the source side channel region is much steeper than those of the other channel regions while device is operating due to non-uniform channel doping. Such a steep potential distribution near the source side enhances the lateral channel electric field and thus increases the carrier mobility. However, this approach suffers from channel dopant diffusion and dopant variation. Also, it is difficult to design the short channel devices.

The present embodiments provide a structure and method of fabricating vertical transport FETs having a gradient threshold voltage with a channel engineering, which improve the device performance due to the enhancement of electric field. In the present embodiments, a scheme of a gradient threshold voltage in VTFETs can be achieved by a dual channel configuration. For nFET Vt control, Low-Ge-Content (LGC, Ge≤20%) SiGe is used near the source and Si is used for the main channel, while pFET Vt is controlled by LGC SiGe (Ge≤20%) near the source and High-Ge-Content (HGC, Ge≥40%) SiGe as the main channel.

In general, vertical transport FET devices (VTFETS) employ doped source and drain regions, where a doped source/drain region for a VTFET can be formed on top of a vertical semiconductor fin, and where a doped source/drain region can be formed underneath the vertical semiconductor fin. In addition, a vertical source/drain (S/D) contact of the vertical FET device can be disposed adjacent to the vertical semiconductor fin as an elongated bar contact. The vertical S/D contact can be formed to make contact to an upper surface of the underlying S/D region, and can be disposed at a sufficient distance from the vertical semiconductor fin so that the vertical S/D contact does not electrically short to the vertical metal gate structure formed on the vertical semiconductor fin.

In certain embodiments, methods and devices employing techniques for fabricating or constructing vertical transport field effect transistor (VTFETs) having a gradient threshold voltage are provided, which improves device performance due to the enhancement of the electric field. The gradient threshold voltage of the VTFETs in the exemplary embodiments of the present invention can be achieved by a dual channel configuration. For nFET Vt control, Low-Ge-Content (LGC, Ge≤20%) SiGe is used near the source and Si is used for the main channel, while pFET Vt is controlled by LGC SiGe (Ge≤20%) near the source and High-Ge-Content (HGC, Ge≥40%) SiGe as the main channel. A steep potential distribution near the source side enhances the lateral channel electric field and thus increases carrier mobility. In certain embodiments, an asymmetric threshold voltage is present along the channel of the VTFET in a region defined at a bottom (i.e., the side closest to the substrate) of the first and second set of fins.

Examples of semiconductor materials that can be employed in forming such structures include silicon (Si), germanium (Ge), silicon germanium alloys (SiGe), carbon doped silicon (Si:C), carbon doped silicon germanium carbide (SiGe:C), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present embodiments will be described in terms of a given illustrative architecture; however, other architectures, structures, substrate materials and process steps/blocks can be varied within the scope of the present disclosure. It should be noted that certain features cannot be shown in all figures for the sake of clarity. This is not intended to be interpreted as a limitation of any particular embodiment, or illustration, or scope of the claims.

Referring now to the figures and initially to FIG. 1, this figure is a cross-sectional view of a semiconductor structure 100 at an intermediate stage in the manufacturing process, and including channel epi over a semiconductor substrate, in accordance with certain embodiments. In various exemplary embodiments, a semiconductor structure 100 includes a semiconductor substrate 102. A Low-Ge-Content (LGC) layer 104 is formed by epitaxial growth on the substrate 102. As discussed above, the LCG material of the LGC layer 104 may have a germanium content of, for example, Ge≤20%. Then, a first material layer 106 and a second material layer 108 are epitaxially grown over the LGC layer 104.

The substrate 102 can be crystalline, semi-crystalline, microcrystalline. The substrate 102 can be essentially (e.g., except for contaminants) a single element (e.g., silicon), primarily (e.g., with doping) of a single element, for example, silicon (Si) or germanium (Ge), or the substrate 102 can include a compound, for example, GaAs, SiC, or SiGe. The substrate 102 can also have multiple material layers. In some embodiments, the substrate 102 includes a semiconductor material including, but not necessarily limited to, silicon (Si), silicon germanium (SiGe), Si:C (carbon doped silicon), carbon doped silicon germanium (SiGe:C), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 102. In some embodiments, the substrate 102 includes both semiconductor materials and dielectric materials.

In certain examples, the first material layer 106 can be, e.g., Si or carbon doped silicon (Si:C) material, and the second material layer 108 can be, e.g., a High-Ge-Content (HGC) silicon germanium (SiGe) material. As discussed above, HCG material of the second material layer 108 may have a germanium content of, for example, Ge≥40%. In certain examples, the carbon (C) and germanium (Ge) concentrations are low enough to avoid any defects.

Figure 2:
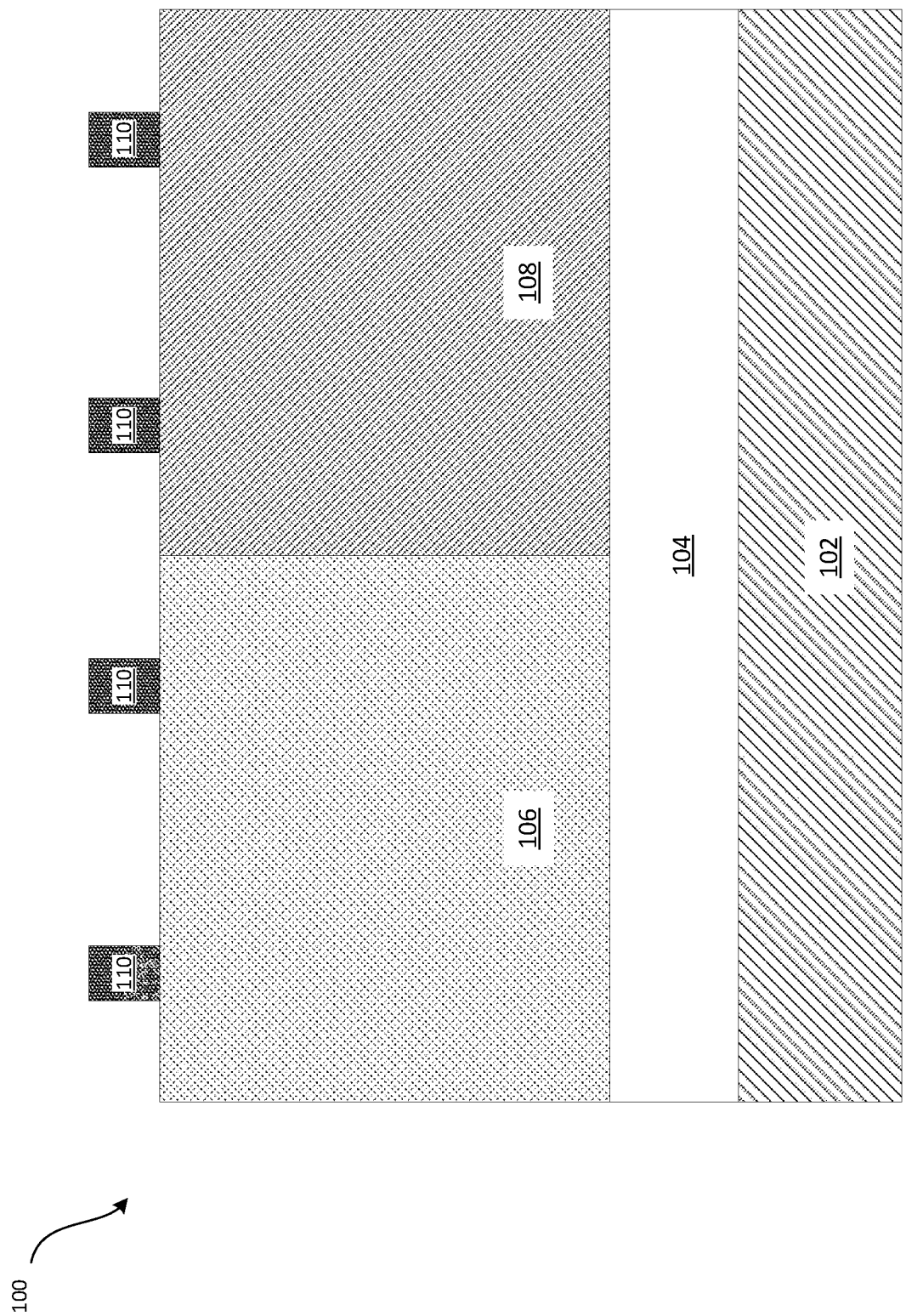
FIG. 2 is a cross-sectional view of the semiconductor structure of FIG. 1 where a hardmask is formed over the semiconductor substrate, in accordance with an embodiment.

Referring now to FIG. 2, this figure is a cross-sectional view of the semiconductor structure 100 of FIG. 1 at a subsequent stage of the manufacturing process, where a hardmask 110 has been formed over the first material layer 106 and the second material layer 108. The material of the hardmask 110 may be any suitable material to allow for subsequent etching and fin formation of the semiconductor structure 100.

Figure 3:
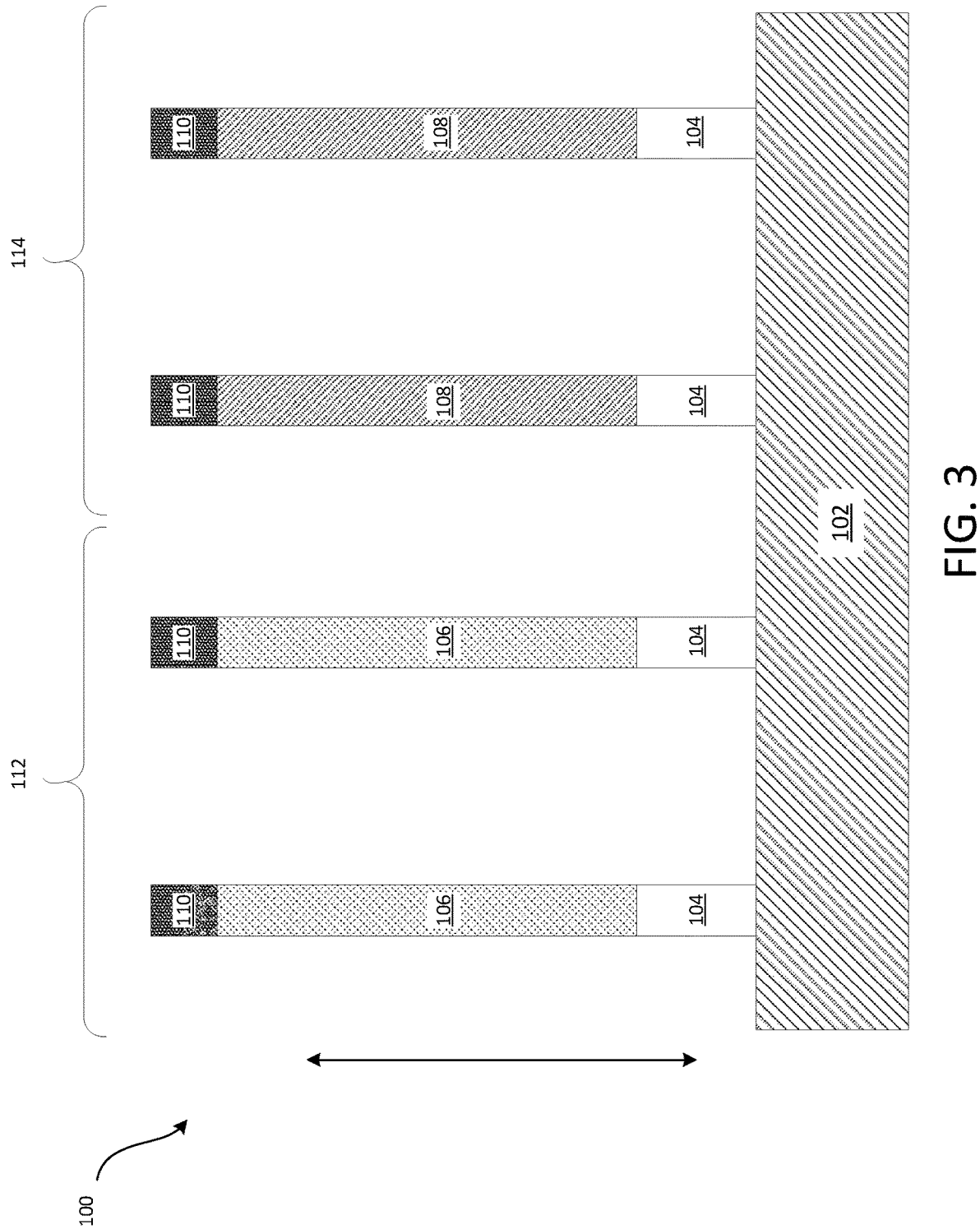
FIG. 3 is a cross-sectional view of the semiconductor structure of FIG. 2 where a plurality of fins are formed over the semiconductor substrate, in accordance with an embodiment.

Referring now to FIG. 3, this figure is a cross-sectional view of the semiconductor structure 100 of FIG. 2 at a subsequent stage of the manufacturing process, where a plurality of fins are formed over the semiconductor substrate 102, in accordance with an embodiment. In various exemplary embodiments, the first material layer 106 and the second material layer 108 are etched to form a plurality of the fins (i.e., the high aspect ratio remaining portions of the first material layer 106 and the underlying LCG layer 104, as well as the high aspect ratio remaining portions of the second material layer 108 and the underlying LCG layer 104). In certain embodiments, the SiGe layer has a length in a vertical extending direction (see arrows in FIG. 3) of the first set of fins that is 20-50% of a total channel length of the semiconductor structure in the vertical extending direction. The first set of fins including the first material layer 106 are formed from Si or Si:C, whereas the second set of fins including the second material layer 108 are formed from the HGC SiGe layer (e.g., Ge≥40%). After etching the fins, portions of the hardmask 110 remain over the first and second sets of fins. The first set of fins including the first material layer 106 will enable the formation of an n-type field effect transistor (nFET) device in an nFET region 112, and the second set of fins including the second material layer 108 will enable the formation of a p-type field effect transistor (pFET) device in a pFET region 114.

In general, the plurality of fins (i.e., the fins including the first material layer 106 and the fins including the second material layer 108) can be formed from a semiconductor material including, but not limited to Si, strained Si, Si:C, SiGe, SiGe:C, Si alloys, Ge, Ge alloys, GaAs, InAs, InP, as well as other III/V and II/VI compound semiconductors. However, as mentioned herein, in certain embodiments, the composition of the second material layer 108 is HGC SiGe layer (e.g., Ge≥40%), relative to the lower Ge content (e.g., Ge≤20%) of the LGC layer 104. The plurality of fins may be etched by employing a dry etching process such as, for example, reactive ion etching, plasma etching, ion etching or laser ablation. The etching can further include a wet chemical etching process in which one or more chemical etchants are employed to remove portions of the layers.

The hardmask 110 can be manufactured of silicon nitride (SiN), deposited using, for example, low pressure chemical vapor deposition (LPCVD). In other example embodiments, the hardmask 16 can include, but is not limited to, hafnium oxide ($HfO_2$) or tantalum nitride (TaN) or titanium nitride (TiN). In some embodiments, the hardmask 110 can include multiple layers, for example, silicon nitride on top of silicon oxide. In some embodiments, the vertical thickness of the hardmask 110 ranges from about 30 nm to about 150 nm. The hardmask 110 can be formed by any suitable patterning technique, including but not limited to, sidewall image transfer (SIT), self-aligned double patterning (SADP), self-aligned quadruple patterning (SAQP), lithography followed by etching, etc.

Figure 4:
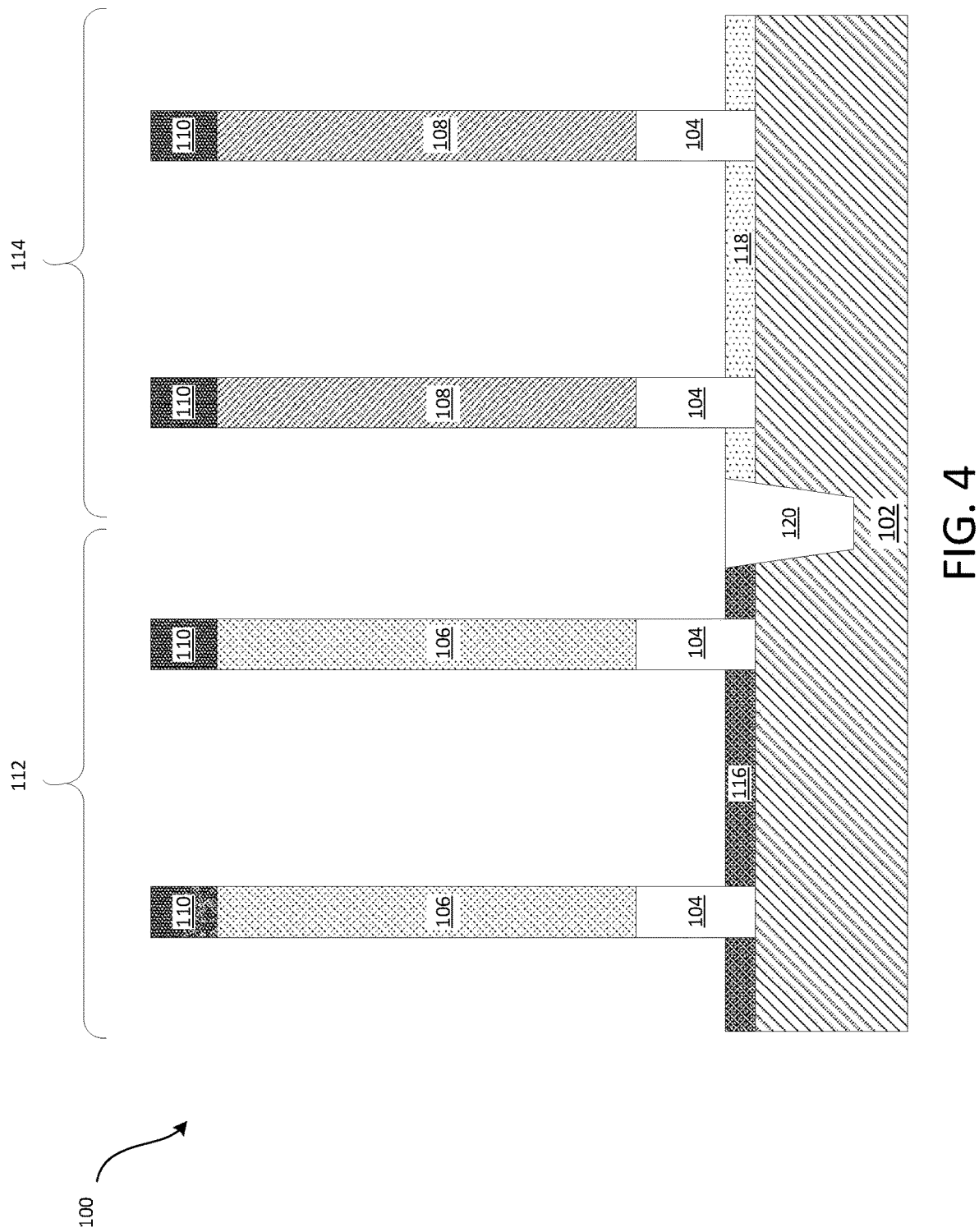
FIG. 4 is a cross-sectional view of the semiconductor structure of FIG. 3 where bottom source/drain regions are formed, in accordance with an embodiment.

Referring now to FIG. 4, this figure is a cross-sectional view of the semiconductor structure of FIG. 3 at a subsequent stage of the manufacturing process, where bottom source/drain regions are formed, in accordance with an embodiment. As shown in FIG. 4, in various exemplary embodiments, bottom source/drain regions 116, 118 are formed. The source/drain regions 116 can be formed in the nFET region 112 and source/drain regions 118 can be formed in the pFET region 114. Additionally, a shallow trench isolation (STI) region 120 can be formed between the nFET region 112 and the pFET region 114. The STI region 120 can separate the source/drain region 116 of the nFET from the source/drain region 118 of the pFET.

Bottom source/drain regions 116, 118 can be epitaxially grown over the substrate 102. Source/drain regions 116, 118 can be, e.g., Si:P for an nFET (nFET region 112) and SiGe:B for a pFET (pFET region 114). It is to be understood that the term "source/drain region" as used herein means that a given source/drain region can be either a source region or a drain region, depending on the application. In one exemplary embodiment, the source/drain region 116 is formed between the Si:C fins (i.e., including the first material layer 106) in the nFET region 112 and the source/drain region 118 is formed between the HGC SiGe fins (i.e., including the second material layer 108) in the pFET region 114.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Shallow trench isolation (STI) region 120 is formed in the substrate 102 to electrically isolate regions of adjacent semiconductor devices that are formed over the substrate 102. STI region 120 can include oxide (STI oxide), and the STI region 120 can have a corresponding STI step height.

Figure 5:
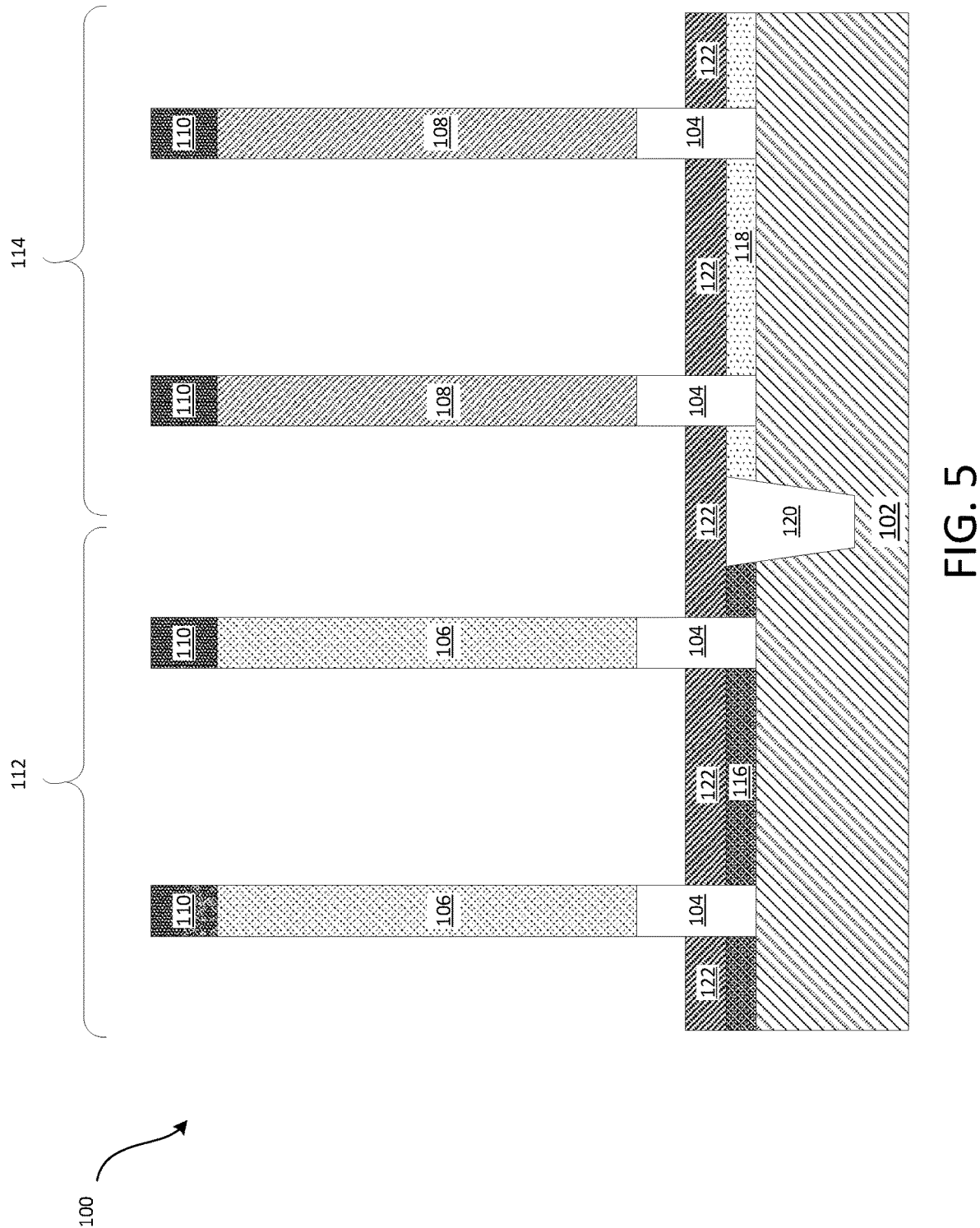
FIG. 5 is a cross-sectional view of the semiconductor structure of FIG. 4 where bottom spacers are formed over the bottom source/drain regions, in accordance with an embodiment.

Referring now to FIG. 5, this figure is a cross-sectional view of the semiconductor structure of FIG. 4 at a subsequent stage of the manufacturing process, where bottom spacers are formed over the bottom source/drain regions, in accordance with an embodiment. As shown in FIG. 5, in various exemplary embodiments, bottom spacers 122 can be formed over the bottom source/drain regions 116, 118 in the nFET region 112 and the pFET region 114. Bottom spacers 122 can include a low-κ dielectric formed according to known processes. The term "low-κ dielectric" generally refers to an insulating material having a dielectric constant less than silicon dioxide, e.g., less than 3.9. Exemplary low-κ dielectric materials include, but are not limited to, dielectric nitrides (e.g., SiN, SiBCN), dielectric oxynitrides (e.g., SiOCN, SiCO), or any combination thereof or the like.

Figure 6:
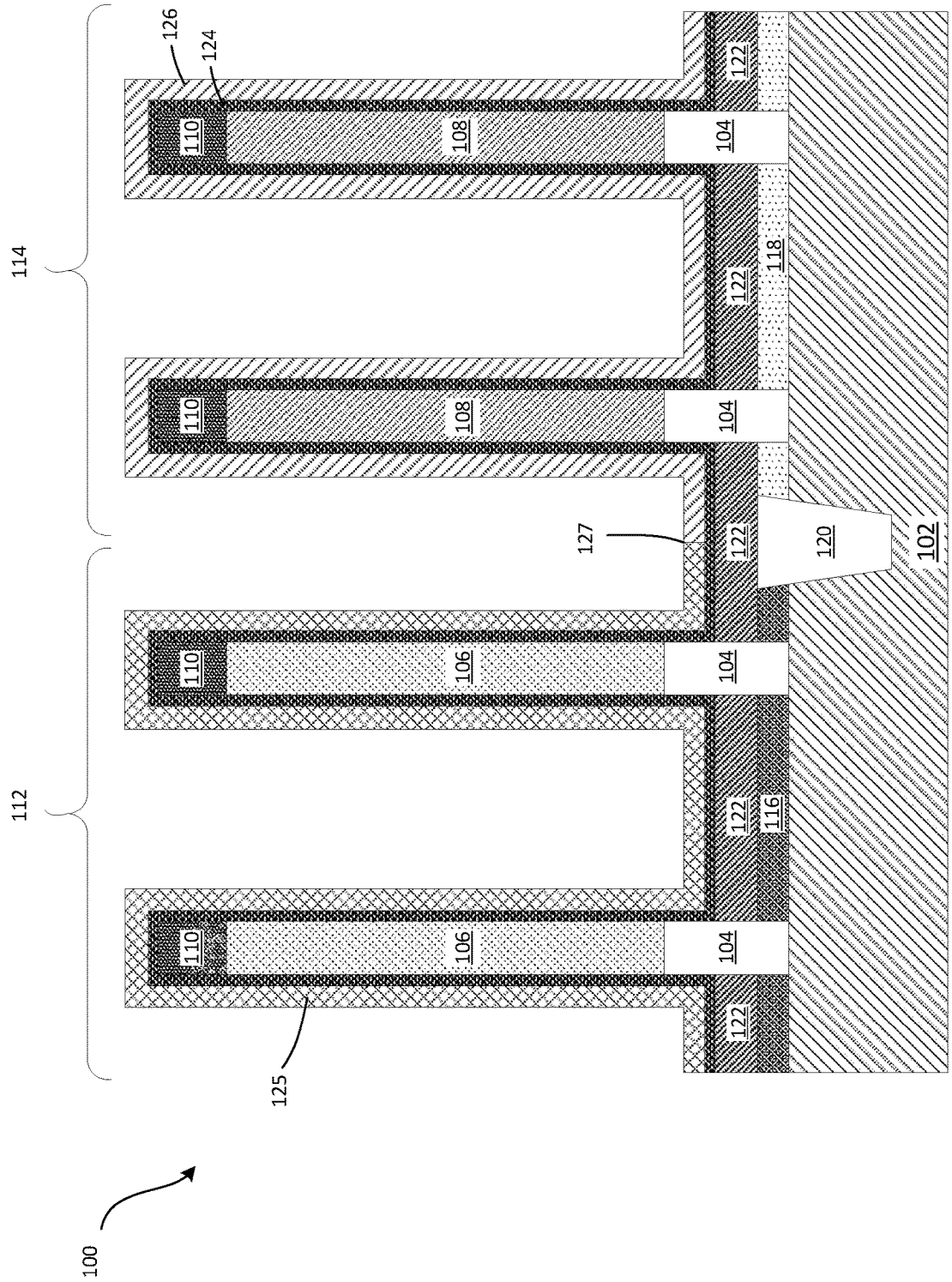
FIG. 6 is a cross-sectional view of the semiconductor structure of FIG. 5 where a high-κ metal gate is formed over the plurality of fins, in accordance with an embodiment.

Referring now to FIG. 6, this figure is a cross-sectional view of the semiconductor structure of FIG. 5 at a subsequent stage of the manufacturing process, where a high-κ metal gate is formed over the plurality of fins, in accordance with an embodiment. As shown in FIG. 6, in various exemplary embodiments, a high-κ metal gate is formed over the plurality of fins. The high-κ layer 124 of the high-κ metal gate extends over the first set of fins (i.e., including the first material layer 106) and the second set of fins (i.e., including the second material layer 108). An nFET region metal gate 125 is then formed over the high-κ layer 124 in the nFET region 112 and a pFET region metal gate 126 is then formed over the high-κ layer 124 in the pFET region 114. Thus, the nFET region metal gate 125 extends to point 127 defined over the STI region 120 and the pFET region metal gate 126 extends from point 127 over the STI region 120 and into the pFET region 114.

The high-κ layer 124 can include a hafnium oxide ($HfO_2$) layer deposited to a thickness of approximately 2 nm. High-κ layer 124 can be formed using atomic layer deposition (ALD), which involves the deposition of successive monolayers over a substrate within a deposition chamber usually maintained at sub-atmospheric pressure. Furthermore, it will be appreciated that "high-κ" generally refers to a dielectric material having a dielectric constant (κ) value greater than that of silicon oxide. Preferably, the high-κ material has a dielectric constant greater than 5, more preferably greater than about 10. Exemplary high-κ materials include, without limitation, $HfO_2$, $ZrO_2$, $Al_2O_3$, $TiO_2$, $Ta_2O_5$, lanthanide oxides and mixtures thereof, silicates and materials such as YSZ (yttria-stabilized zirconia), BST, BT, ST, and SBT.

The nFET region metal gate 125 (or nWFM layer) can be selectively grown over high-κ layer 124 and can include aluminum (Al) or an aluminum/titanium (Al/Ti) multilayer stack, where the Al/Ti thickness can be tuned for target composition ratio to achieve the desired work function. Both Al and Ti could be selectively grown. In other exemplary embodiments, the nFET region metal gate 125 can be, e.g., TiN, TiAlC, TaN, etc. In one embodiment, the nFET region metal gate 125 is a multi-layered stack including TiN/TiAlC/TiN.

The pFET region metal gate 126 (or pWFM layer) can be selectively grown over the high-κ layer 124 and can include TiN. In certain embodiments, the second high-κ metal gate (i.e., pFET region metal gate 126) may be composed of different materials than the first high-κ metal gate (i.e., the nFET region metal gate 125).

Therefore, a high-κ layer 124 can be formed, followed by formation of work function metal (WFM) layers (i.e., the nFET region metal gate 125 and the pFET region metal gate 126) according to one polarity device (for example nFET or pFET) on the wafer and according to another polarity device (for example nFET or pFET). It is appreciated that an nFET uses one type of WFM and a pFET uses another type of WFM. In one example, the pFET region metal gate 126 can be TiN for a pFET, and the nFET region metal gate 125 can be Al-doped TiN or TaN, or a multi-layered stack including TiN/TiAlC/TiN, for an nFET.

Figure 7:
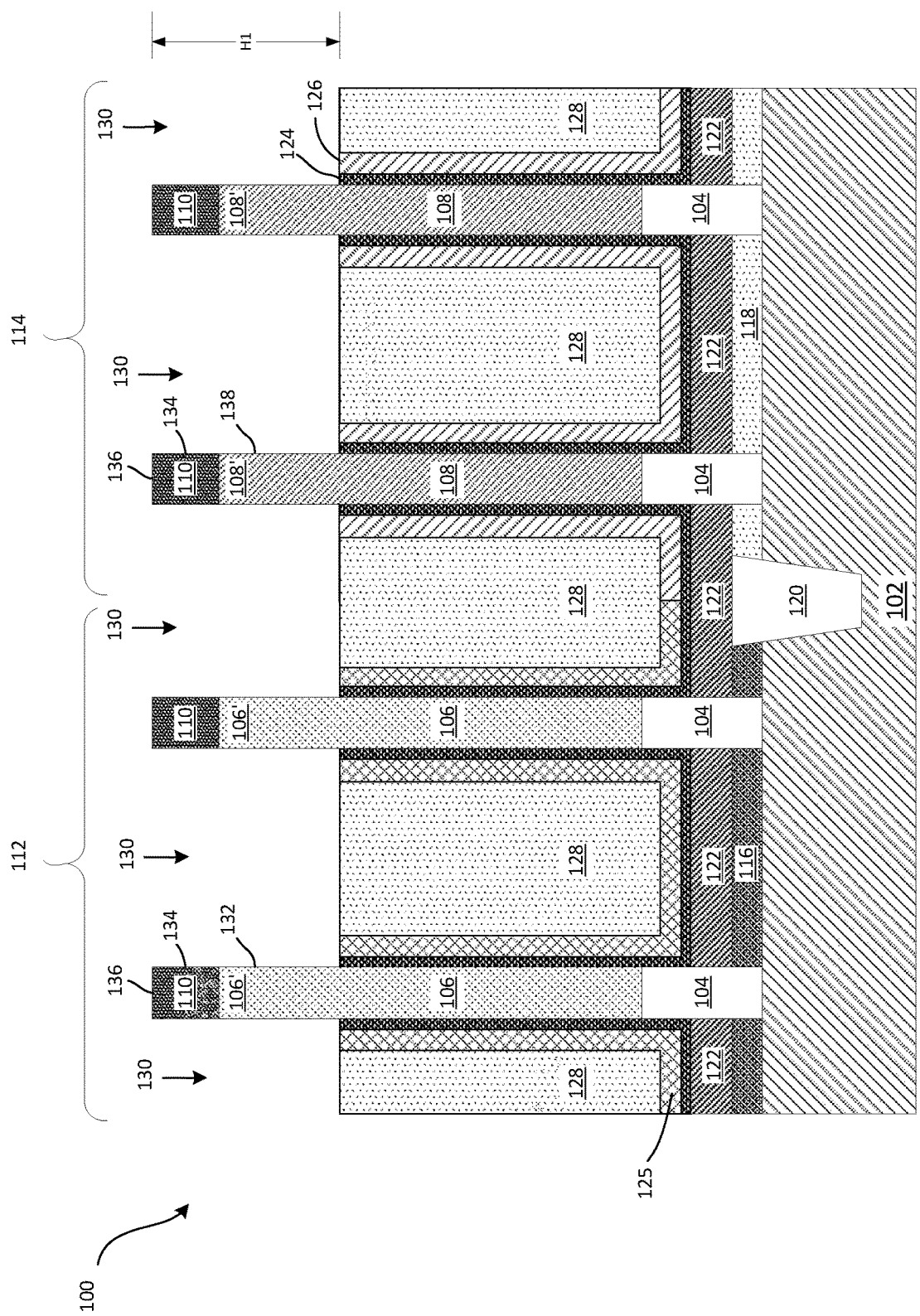
FIG. 7 is a cross-sectional view of the semiconductor structure of FIG. 6 where the high-κ metal gate is recessed to expose a top portion of the plurality of fins, in accordance with an embodiment.

Referring now to FIG. 7, this figure is a cross-sectional view of the semiconductor structure 100 of FIG. 6 at a subsequent stage of the manufacturing process, where the high-κ metal gate is recessed to expose a top portion of the plurality of fins, in accordance with an embodiment. As shown in FIG. 7, in various exemplary embodiments, an organic planarization layer (OPL) 128 is deposited between the first set of fins (i.e., the fins including the first material layer 106 in the nFET region 112) and the second set of fins (i.e., the fins including the second material layer 108 in the pFET region 114). Then, the OPL 128 and the high-κ metal gates (i.e., the high-κ layer 124 and the nFET region metal gate 125 in the nFET region 114, and the high-κ layer 124 and the pFET region metal gate 126 in the nFET region 114) are recessed to expose top portions 106' and 108' of the plurality of fins. The recess can extend a distance "H1." The recess further creates openings 130 between the exposed top portions 106' and 108' of the plurality of fins. The recess exposes sidewalls 132 of top portion 106' of fins. The recess further exposes sidewalls 138 of top portions 108' of fins. Additionally, the hardmask 110 remains over the plurality of fins. The top surface 136 and sidewalls 134 of the hardmask 110 are thus exposed.

Figure 8:
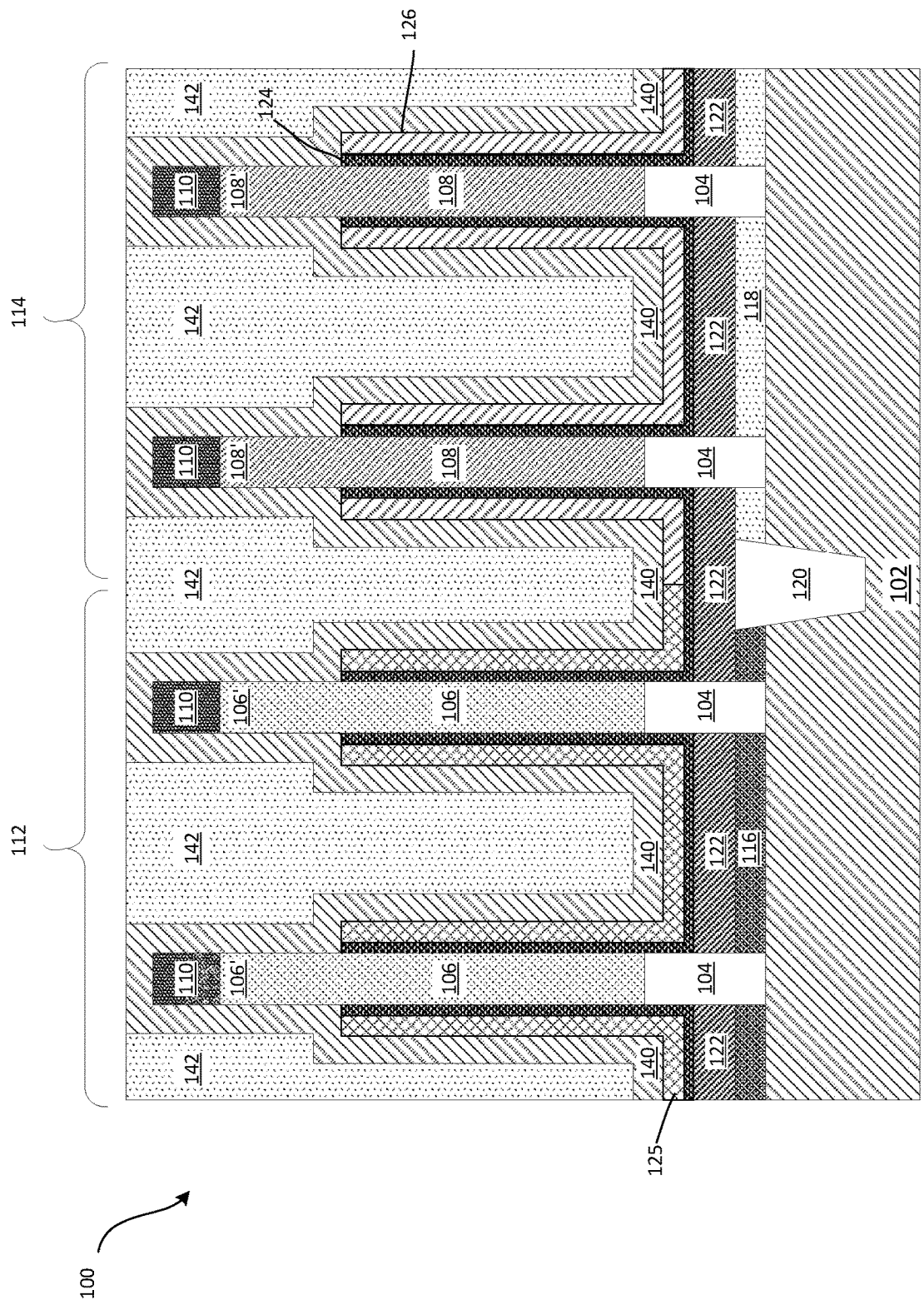
FIG. 8 is a cross-sectional view of the semiconductor structure of FIG. 7 where gate encapsulation takes place, in accordance with an embodiment.

Referring now to FIG. 8, this figure is a cross-sectional view of the semiconductor structure 100 of FIG. 7 at a subsequent stage of the manufacturing process, where gate encapsulation takes place, in accordance with an embodiment. As shown in FIG. 8, in various exemplary embodiments, gate encapsulation takes place. Gate encapsulation can include deposition of a first gate encapsulation layer 140 and a second gate encapsulation layer 142. The first gate encapsulation layer 140 can be a nitride, such as, e.g., SiN or SiBCN. The second gate encapsulation layer 142 can be an oxide, such as, e.g., $SiO_2$. The first gate encapsulation layer 140 is deposited over the plurality of fins, whereas the second gate encapsulation layer 142 is deposited between the plurality of fins.

In certain embodiments, the second gate encapsulation layer 142 can be planarized. The planarizing process can include chemical mechanical polishing (CMP) followed by an etch process. Thus, the planarization process can be provided by CMP. Other planarization processes can include grinding and polishing.

Figure 9:
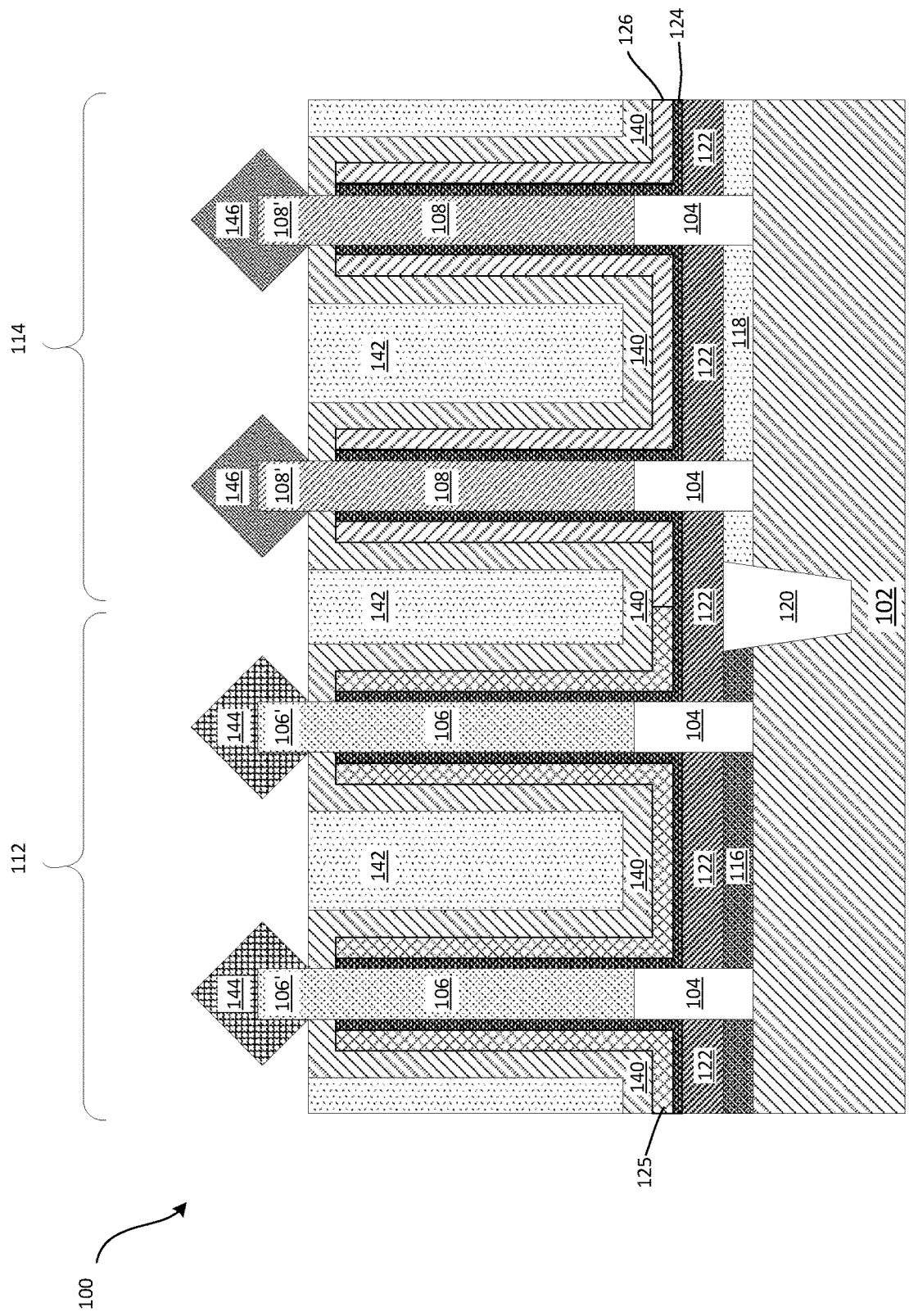
FIG. 9 is a cross-sectional view of the semiconductor structure of FIG. 8 where top source/drain regions are formed over and in direct contact with the exposed top portion of the plurality of fins, in accordance with an embodiment.

Referring now to FIG. 9, this figure is a cross-sectional view of the semiconductor structure 100 of FIG. 8 at a subsequent stage of the manufacturing process, where top source/drain regions are formed over and in direct contact with the exposed top portion of the plurality of fins, in accordance with an embodiment. As shown in FIG. 9, in various exemplary embodiments, the first and second gate encapsulation layers 140, 142 are recessed until the top portions 106', 108' of the plurality of fins respectively, are exposed. This results in the removal of the hardmask 110 and having a remaining portion of the second gate encapsulation layer 142. The high-κ layer 124 and the nFET region metal gate 125 in the nFET region 112, remain intact. Also, the high-κ layer 124 and the pFET region metal gate 126 in the pFET region 114 remain intact from the recess of the first and second gate encapsulation layers 140, 142. The top portion of the high-κ layer 124, the nFET region metal gate 125 in the nFET region 112, and the pFET region metal gate 126 in the pFET region 114 are protected by a remaining section of the first encapsulation layer 140.

Recessing the first and second encapsulation layers 140, 142 can be performed by wet etch processing. In one example, a vertical wet etch can be employed to define the channel length. Non-limiting examples of wet etch processes that can be used to form the recess include hydrogen peroxide ($H_2O_2$), potassium hydroxide (KOH), ammonium hydroxide (ammonia), tetramethylammonium hydroxide (TMAH), hydrazine, ethylene diamine pyrocatechol (EDP), or any combination thereof.

Subsequently, top source/drain regions 144 are formed over the exposed top portions 106' of the fins in the nFET region 112 and top source/drain regions 146 are formed over the exposed top portions 108' of the fins in the pFET region 114.

Top source/drain regions 144, 146 can be epitaxially grown. Source/drain regions 144, 146 can be, e.g., Si:P for an nFET (in nFET region 112) and SiGe:B for a pFET (in pFET region 114). Thus, the top source/drain region is different for the Si:C fins in the nFET region 112 compared to the top source/drain region for the SiGe fins in the pFET region 114. It is to be understood that the term "source/drain region" as used herein means that a given source/drain region can be either a source region or a drain region, depending on the application.

Figure 10:
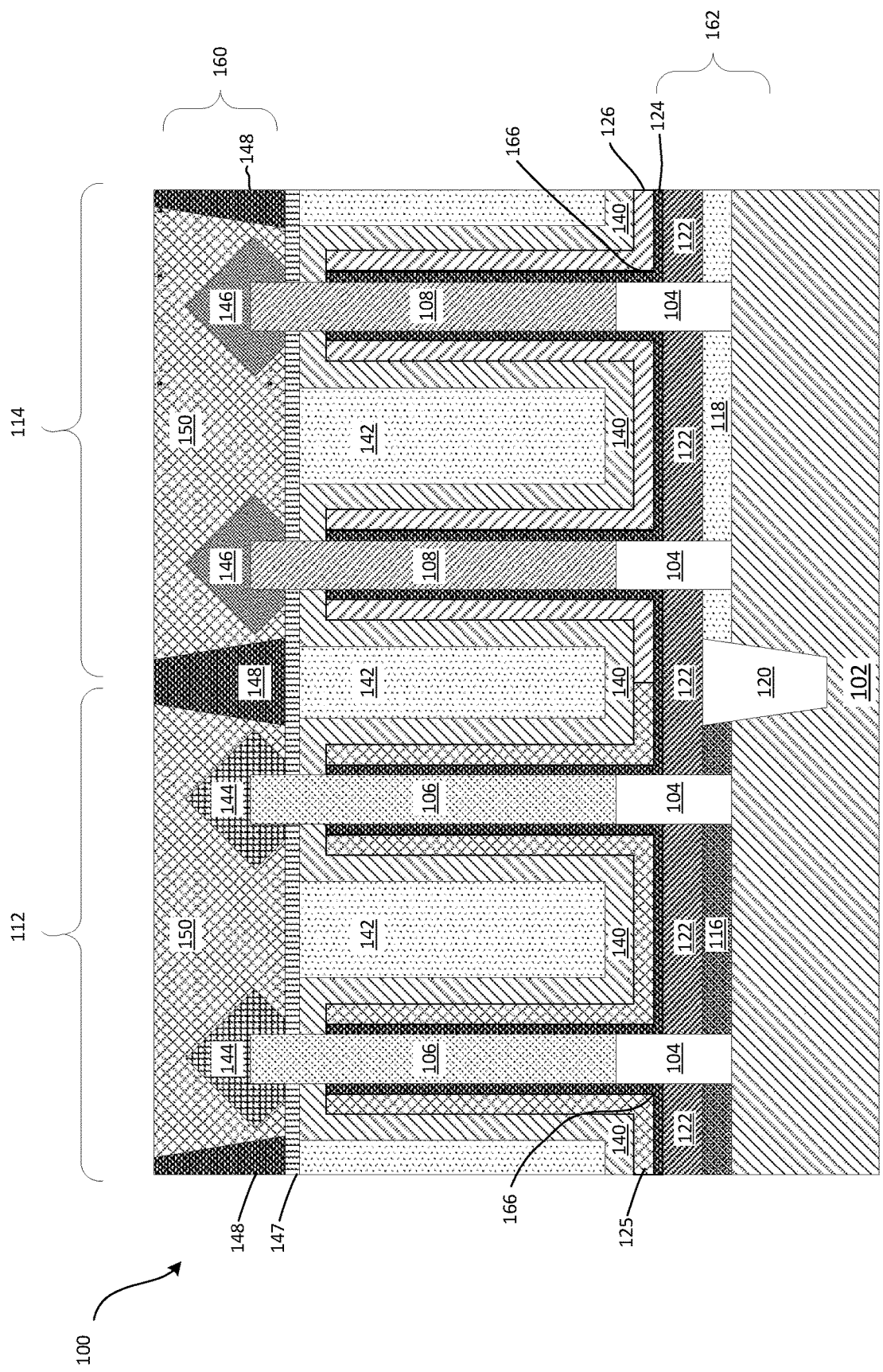
FIG. 10 is a cross-sectional view of the semiconductor structure of FIG. 9 where metallization of the top/source drain regions takes place, in accordance with an embodiment.

Referring now to FIG. 10, this figure is a cross-sectional view of the semiconductor structure 100 of FIG. 9 at a subsequent stage of the manufacturing process, where metallization of the top/source drain regions 144, 146 takes place, in accordance with an embodiment. As shown in FIG. 10, in various exemplary embodiments, top spacers 147 are formed. Top spacer material can be formed over the entire structure. The top spacers 147 can directly contact a lower region of the top source/drain regions 144, 146. Examples of top spacer 147 material can include oxides and nitrides (such as, e.g., SiN, SiBCN, SiOCN). The top spacer 147 material can be a low-κ dielectric material. In one implementation, the top spacer 147 material can be formed with techniques analogous to forming the bottom spacer 122 material. The bottom spacer 122 material can be thicker than the top spacer 147 material.

In various exemplary embodiments, metallization of the top/source drain regions 144, 146 takes place. The metallization includes forming metal layer 150 (i.e., metal fill layer or fill layer). The metal layer 150 contacts and encapsulates or encompasses top source/drain regions 144 in the nFET region 112 and top source/drain regions 146 in the pFET region 114. Additionally, contacts 148 can be formed through the metal layer 150. Contacts 148 can be source, drain, or gate contacts. Area 160 can be referred to as the drain and area 162 can be referred to as the source. A gradient threshold voltage can be achieved in regions 166 near the source area 162.

In one exemplary embodiment, the metal layer 150 can be, e.g., a titanium/titanium nitride (Ti/TiN) layer or liner. In other exemplary embodiments, the metal layer 150 can be formed from, e.g., Ti, TiN, Ni, etc. The metal layer 150 can be deposited by, e.g., an ALD process. The metal layer 150 can be planarized. The planarizing process can include chemical mechanical polishing (CMP) followed by an etch process. Therefore, the planarization process can be provided by CMP. Other planarization processes can include grinding and polishing.

Consequently, the exemplary embodiments have a gradient threshold voltage in the VTFETs, which improves device performance due to the enhancement of the electric field. The gradient threshold voltage of the VTFETs in the exemplary embodiments can be achieved by a dual channel configuration. For nFET Vt control, Low-Ge-Content (LGC, Ge≤20%) SiGe is used near the source and Si is used for the main channel, while pFET Vt is controlled by LGC SiGe (Ge≤20%) near the source and High-Ge-Content (HGC, Ge≥40%) SiGe as the main channel. The asymmetric threshold voltage profile can be seen at a steep potential distribution near the source side, which enhances the lateral channel electric field and thus increases carrier mobility.

Moreover, the present embodiments describe structures and method of manufacturing the structures having a gradient threshold voltage in vertical transport FETs (VTFETs), which improve the device performance due to the enhancement of electric field. In particular, the present embodiments have a scheme of a gradient threshold voltage in VTFETs that can be achieved by a dual channel configuration. For nFET Vt control, Low-Ge-Content (LGC, Ge≤20%) SiGe is used near the source and Si is used for the main channel, while pFET Vt is controlled by LGC SiGe (Ge≤20%) near the source and High-Ge-content (HGC, Ge≥40%) SiGe as the main channel. The structure according the present embodiments may provide >100 mV higher Vt near the sources, which may be required for a performance boost.

Regarding FIGS. 1-10, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

It is to be understood that the present embodiments will be described in terms of a given illustrative architecture; however, other architectures, structures, substrate materials and process features and steps/blocks can be varied within the scope of the present embodiments.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming an asymmetric threshold voltage vertical transport field effect transistor (VTFET) with intrinsic dual channel epitaxy (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure for triggering asymmetric threshold voltage along a channel of a vertical transport field effect transistor (VTFET), the semiconductor structure comprising:
    a first set of fins, each of the first set of fins including a low germanium content layer and a first material layer formed on the low germanium content layer, the low germanium content layer including SiGe with a Ge content of ≤20%, and the first material layer is comprised of Si or a carbon doped Si material;
    a second set of fins adjacent to the first set of fins, each of the second set of fins including the low germanium content layer and a high germanium content layer formed on the low germanium content layer for each of the second set of fins, the high germanium content layer including SiGe with a Ge content of ≥40%;
    a first high-κ metal gate disposed over the first set of fins; and
    a second high-κ metal gate disposed over the second set of fins, wherein an asymmetric threshold voltage is present along the channel of the VTFET in a region defined at a bottom of the first set of fins and the second set of fins.

2. The semiconductor structure of claim 1, wherein the low germanium content layer has a length in a vertical extending direction of the first set of fins that is 20-50% of a total channel length of the semiconductor structure in the vertical extending direction.

3. The semiconductor structure of claim 1, wherein the second high-κ metal gate is composed of different materials than the first high-κ metal gate.

4. The semiconductor structure of claim 1, wherein a shallow trench isolation (STI) region separates a bottom source region from a bottom drain region.

5. The semiconductor structure of claim 4, wherein top source/drain regions are disposed over exposed top portions of the first set of fins and the second set of fins.

6. The semiconductor structure of claim 5, wherein a metal fill is disposed over the top source/drain regions.

7. The semiconductor structure of claim 6, wherein a bottom spacer is disposed between the first high-κ metal gate and the bottom source and drain regions.

8. A method of fabricating a semiconductor structure for triggering asymmetric threshold voltage along a channel of a vertical transport field effect transistor (VTFET), the method comprising:

forming a first set of fins, each of the first set of fins including a low germanium content layer and forming a first material layer on the low germanium content layer, the low germanium content layer including SiGe with a Ge content of ≤20%, and the first material layer is comprised of Si or a carbon doped Si material;

forming a second set of fins adjacent to the first set of fins, each of the second set of fins including the low germanium content layer and forming a high germanium content layer on the low germanium content layer for each of the second set of fins, the high germanium content layer including SiGe with a Ge content of ≥40%;

forming a first high-κ metal gate over the first set of fins; and forming a second high-κ metal gate over the second set of fins, wherein an asymmetric threshold voltage is present along the channel of the VTFET in a region defined at a bottom of the first set of fins and the second set of fins.

9. The method of claim 8, wherein the low germanium content layer has a length in a vertical extending direction of the first set of fins that is 20-50% of a total channel length of the semiconductor structure in the vertical extending direction.

10. The method of claim 8, wherein the second high-κ metal gate is composed of different materials than the first high-κ metal gate.

11. The method of claim 8, wherein a shallow trench isolation (STI) region separates a bottom source region from a bottom drain region.

12. The method of claim 11, further comprising forming top source/drain regions over exposed top portions of the first set of fins and the second set of fins.

13. The method of claim 12, further comprising forming a metal fill over the top source/drain regions.

14. The method of claim 13, further comprising forming a bottom spacer between the first high-κ metal gate and the bottom source and drain regions.

* * * * *